(12) United States Patent
Abe

(10) Patent No.: US 10,886,738 B2
(45) Date of Patent: Jan. 5, 2021

(54) ELECTRONIC DEVICE AND CONTROL METHOD

(71) Applicant: CANON KABUSHIKI KAISHA, Tokyo (JP)

(72) Inventor: Takamitsu Abe, Asaka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 165 days.

(21) Appl. No.: 15/988,523

(22) Filed: May 24, 2018

(65) Prior Publication Data
US 2018/0351359 A1 Dec. 6, 2018

(30) Foreign Application Priority Data
May 31, 2017 (JP) .................................. 2017-108281

(51) Int. Cl.
*H02J 1/00* (2006.01)
*H02J 3/00* (2006.01)
*H02J 3/12* (2006.01)
*G01R 31/42* (2006.01)
*G01R 31/40* (2020.01)
*H02J 7/00* (2006.01)

(52) U.S. Cl.
CPC ............... *H02J 3/12* (2013.01); *G01R 31/42* (2013.01); *G01R 31/40* (2013.01); *H02J 7/00* (2013.01); *H02J 2207/40* (2020.01)

(58) Field of Classification Search
USPC ............................................. 307/130, 80, 81
See application file for complete search history.

(56) References Cited

U.S. PATENT DOCUMENTS

| 5,506,490 A | 4/1996 | Demuro |
| 2010/0244571 A1* | 9/2010 | Spitaels .................... H02J 3/14 |
| | | 307/80 |
| 2010/0301674 A1* | 12/2010 | Lin ........................ G06F 1/263 |
| | | 307/66 |

FOREIGN PATENT DOCUMENTS

| JP | H08-505999 A | 6/1996 |
| JP | 11-215692 A | 8/1999 |
| JP | 2000-261975 A | 9/2000 |
| JP | 2004-071556 A | 3/2004 |
| JP | 2015-145099 A | 8/2015 |
| WO | WO95/13643 A1 | 5/1995 |

* cited by examiner

*Primary Examiner* — Rexford N Barnie
*Assistant Examiner* — Dru Parries
(74) *Attorney, Agent, or Firm* — Canon U.S.A., Inc. IP Division

(57) ABSTRACT

A device includes a connection unit, a load unit, a voltage detection unit, and a determination unit. The connection unit is connected to a power supply apparatus. The load unit operates as a constant power load. The voltage detection unit detects a first output voltage of the power supply apparatus when the load unit operates in a first operation mode, and detects a second output voltage of the power supply apparatus when the load unit operates in a second operation mode. The determination unit determines a type or an output capacity of the power supply apparatus, based on the detected first output voltage and the detected second output voltage.

18 Claims, 7 Drawing Sheets

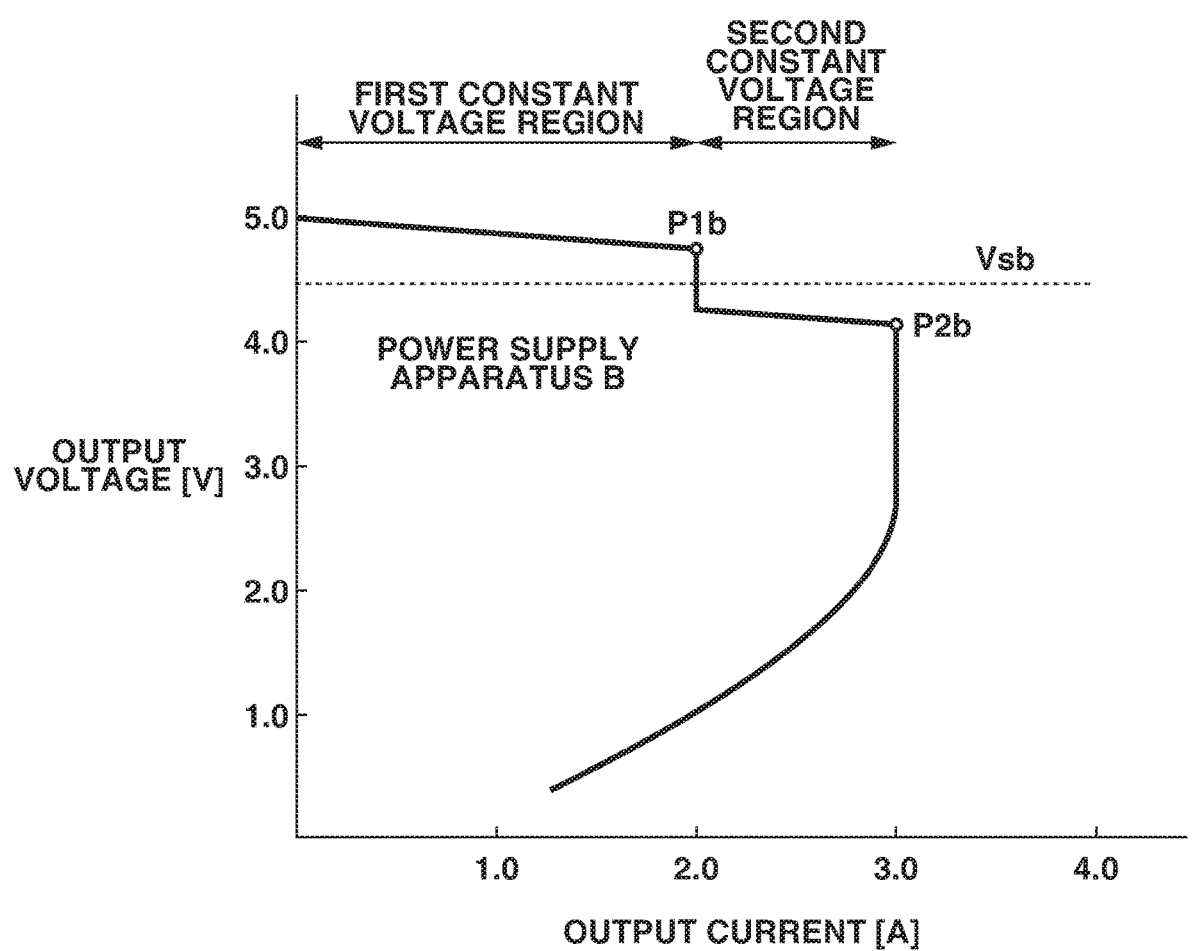

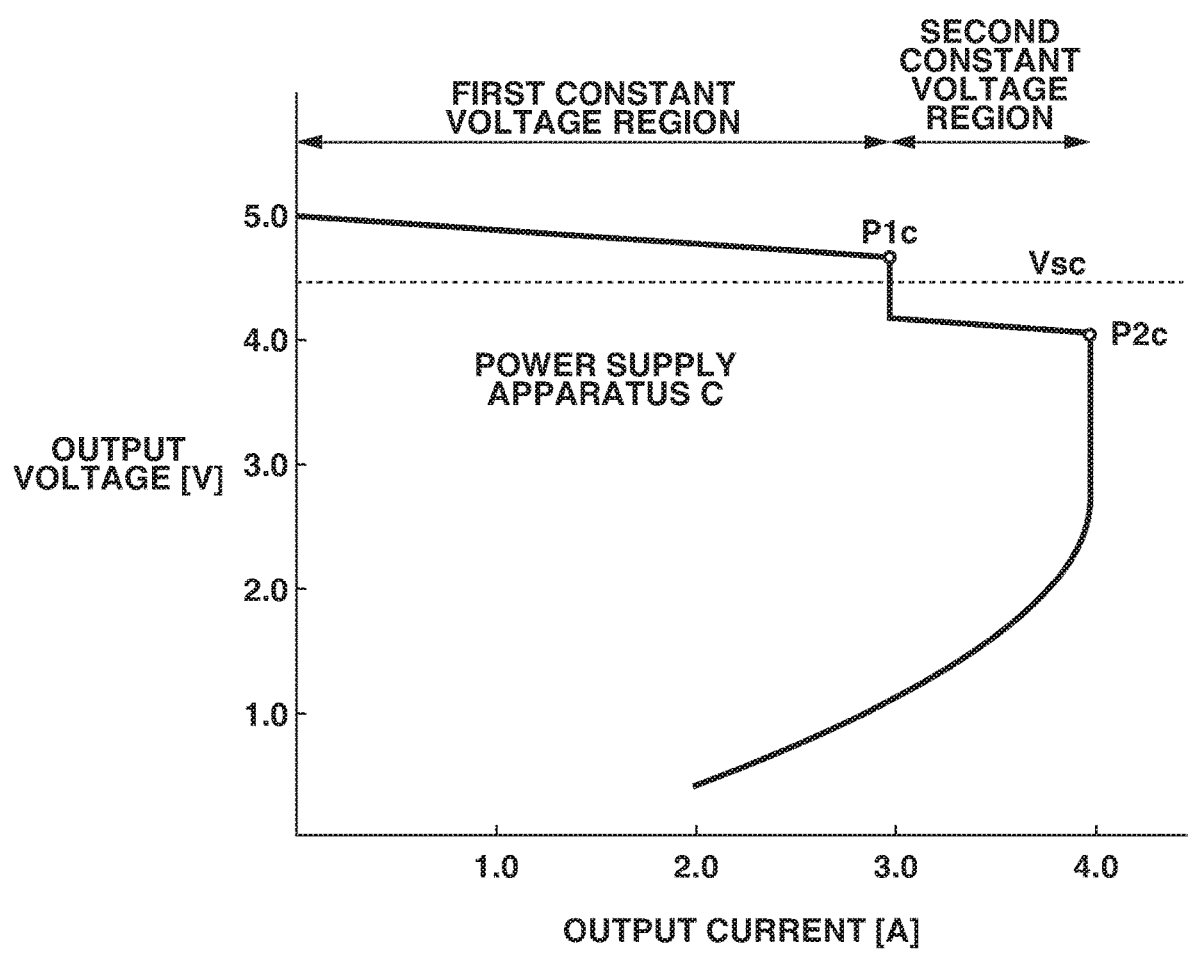

FIG.5A

|  | OUTPUT CAPACITY OF FIRST CONSTANT VOLTAGE REGION | OUTPUT CAPACITY OF SECOND CONSTANT VOLTAGE REGION |
|---|---|---|
| POWER SUPPLY APPARATUS A | 4.9 W | 8.6 W |
| POWER SUPPLY APPARATUS B | 9.6 W | 12.6 W |
| POWER SUPPLY APPARATUS C | 14.1 W | 16.4 W |

FIG.5B

|  | POWER CONSUMPTION |
|---|---|
| MODE 1 | 6.8 W |
| MODE 2 | 11.1 W |
| MODE 3 | 15.3 W |

FIG.5C

|  | POWER CONSUMPTION |
|---|---|
| SWEEP 1 | 3.9 W – 5.9 W |
| SWEEP 2 | 8.1 W – 11.1 W |
| SWEEP 3 | 12.1 W – 16.1 W |

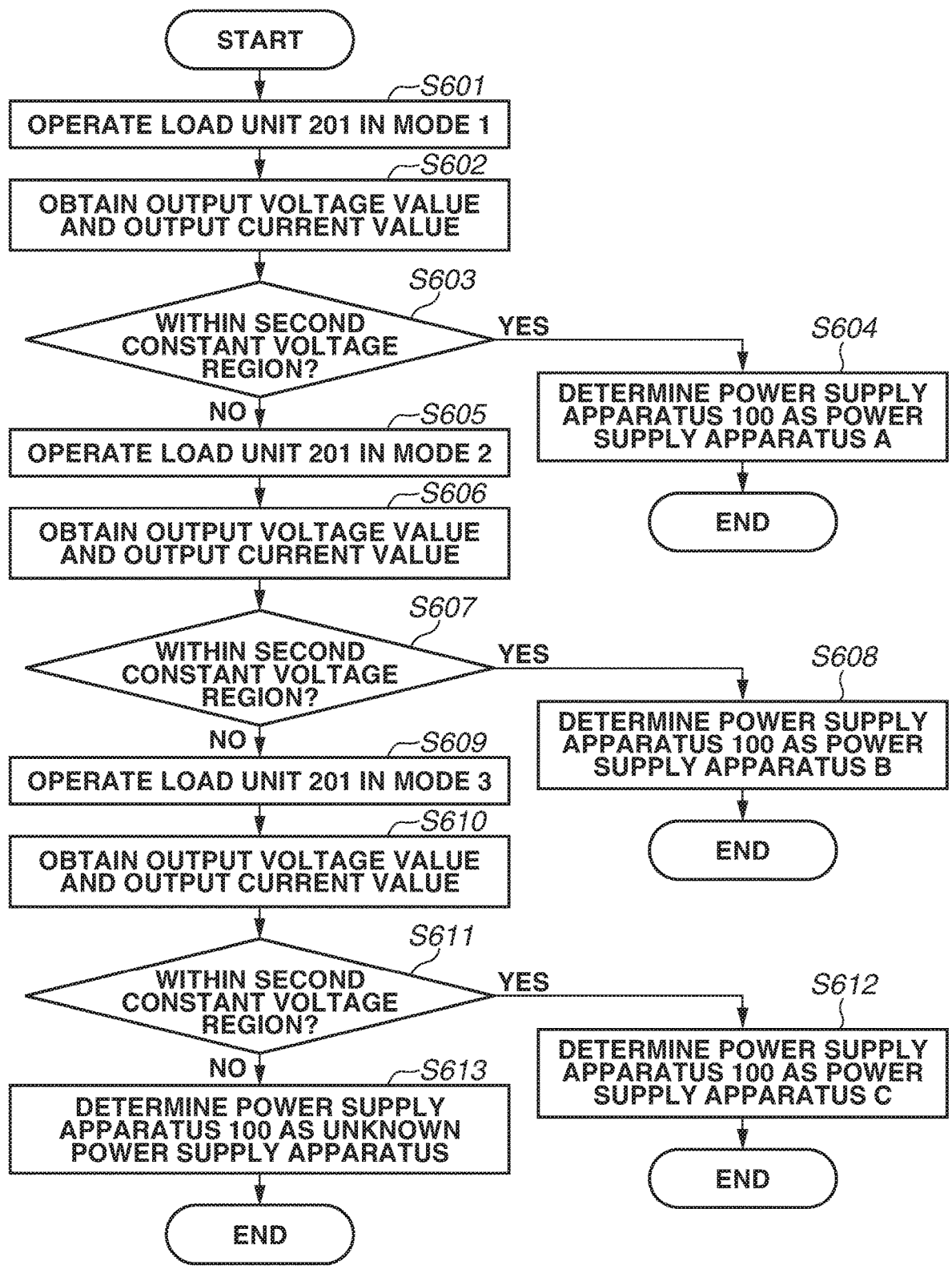

ELECTRONIC DEVICE AND CONTROL METHOD

BACKGROUND

Field of the Invention

Aspects of the disclosure generally relate to an electronic device operable by power supplied from a power supply apparatus, and a control method thereof.

Description of the Related Art

A power supply apparatus such as alternating current (AC) to direct current (DC) adapter can supply direct current to an electronic device operable as a digital camera. When a connector to be connected to a power supply apparatus is a standardized connector such as a Universal Serial Bus (USB) connector, various types of power supply apparatuses can be connected to an electronic device. The USB connector is a connector conforming to Universal Serial Bus (USB) standard. Thus, an electronic device having such a standardized connector is used to have a function of determining a type of a power supply apparatus connected to the connector and determining whether the power supply apparatus is an available power supply apparatus.

Japanese Patent Application Laid-Open No. 11-215692 describes a method for determining a type of a power supply apparatus (a battery or a constant voltage power supply apparatus) from an output voltage of the power supply apparatus connected to a portable electronic device.

However, the method described in Japanese Patent Application Laid-Open No. 11-215692 is a simple method for determining the type of the power supply apparatus by a difference in output voltages. Thus, there is an issue that if there are two or more power supply apparatuses which have different types but output approximately the same output voltage, an electronic device cannot distinguish the types of these power supply apparatuses from one another. In addition, there is an issue that if there are two or more power supply apparatuses which have different output capacities but output approximately the same output voltage, the electronic device cannot distinguish the output capacities of these power supply apparatuses from one another. It is supposed that two or more power supply apparatuses which have different types or output capacities but output approximately the same output voltage will be introduced to a market of power supply apparatuses having standardized connectors such as the USB connectors in the future.

As a method for solving the above-described issues, a method can be considered in which an electronic device communicates with a power supply apparatus and determines a type or an output capacity of the power supply apparatus. However, the method has an issue that the power supply apparatus is to be able to communicate with the electronic device. Power supply apparatuses having USB connectors include some power supply apparatuses which cannot perform USB communication since a D+ line and a D− line are short-circuited, and such power supply apparatuses cannot use the above-described method. Even if a power supply apparatus can communicate with an electronic device, there is an issue that if a period from when communication with the power supply apparatus is started to when a type or an output capacity of the power supply apparatus is determined is too long, the electronic device is to continue an operation by power from the power supply apparatus of which details are unknown.

SUMMARY

According to an aspect of the embodiments, a type or an output capacity of a power supply apparatus can be determined easily and in a short time.

According to an aspect of the embodiments, a type or an output capacity of a power supply apparatus can be determined without communicating with the power supply apparatus.

According to an aspect of the embodiments, there is provided a device includes a connection unit that is connected to a power supply apparatus; a load unit that operates as a constant power load; a voltage detection unit that detects a first output voltage of the power supply apparatus when the load unit operates in a first operation mode, and detects a second output voltage of the power supply apparatus when the load unit operates in a second operation mode; and a determination unit that determines a type or an output capacity of the power supply apparatus, based on the detected first output voltage and the detected second output voltage.

According to an aspect of the embodiments, there is provided a method of controlling a device including a connection unit that is connected to a power supply apparatus and a load unit that operates as a constant power load. The method includes detecting a first output voltage of the power supply apparatus when the load unit operates in a first operation mode; detecting a second output voltage of the power supply apparatus when the load unit operates in a second operation mode; and determining a type or an output capacity of the power supply apparatus, based on the detected first output voltage and the detected second output voltage.

According to an aspect of the embodiments, there is provided a non-transitory storage medium that stores a program causing a computer to execute a method of controlling a device including a connection unit that is connected to a power supply apparatus and a load unit that operates as a constant power load. The method includes detecting a first output voltage of the power supply apparatus when the load unit operates in a first operation mode; detecting a second output voltage of the power supply apparatus when the load unit operates in a second operation mode; and determining a type or an output capacity of the power supply apparatus, based on the detected first output voltage and the detected second output voltage.

Further aspects of the embodiments will become apparent from the following embodiments.

BRIEF DESCRIPTION OF THE DRAWINGS

FIG. 3 illustrates a first constant voltage region and a second constant voltage region of a power supply apparatus B.

FIG. 4 illustrates a first constant voltage region and a second constant voltage region of a power supply apparatus C.

FIG. 5A illustrates three types of power supply apparatuses and examples of information indicating output capacities of the power supply apparatuses.

FIG. 5B illustrates a first example of relationships between three types of operation modes of a load unit and power consumption of the load unit.

FIG. 5C illustrates a second example of relationships between three types of operation modes of the load unit and power consumption of the load unit.

FIG. 6 is a flowchart illustrating an example of a control method of an electronic device according to the first exemplary embodiment.

DESCRIPTION OF THE EMBODIMENTS

Exemplary embodiments, features, and aspects of the disclosure will be described below with reference to the drawings. However, aspects of the disclosure are not limited to the following embodiments.

First Exemplary Embodiment

Figure 1:
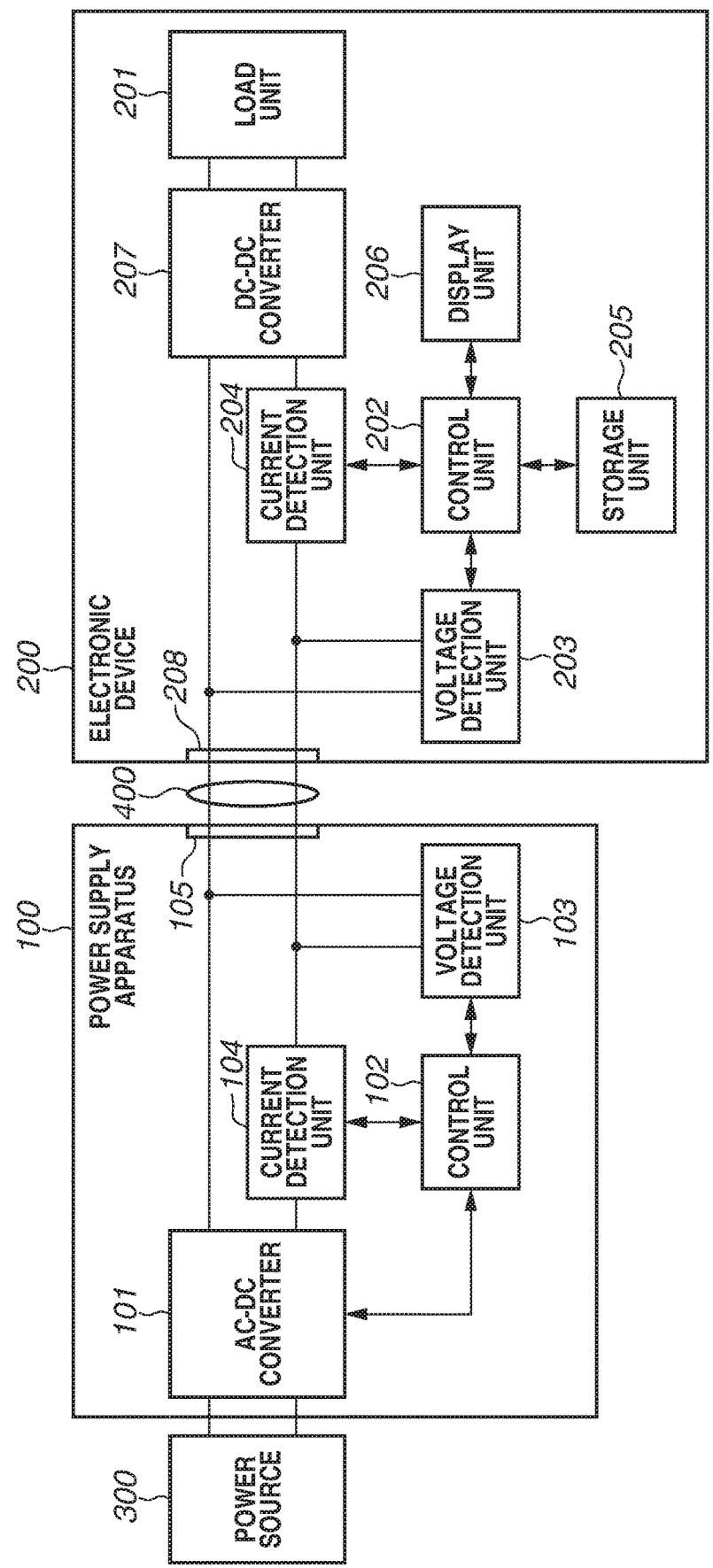
FIG. 1 illustrates an example of a system configuration according to a first exemplary embodiment and other exemplary embodiments.

FIG. 1 illustrates an example of a system configuration according to a first exemplary embodiment.

As illustrated in FIG. 1, a system according to the first exemplary embodiment includes a power supply apparatus 100 connected to a power source 300 and an electronic device 200 connected to the power supply apparatus 100 via a cable 400. According to the first exemplary embodiment, an example is described in which the cable 400 connecting the power supply apparatus 100 and the electronic device 200 is a cable connectable to a connector conforming to Universal Serial Bus (USB) standard (hereinbelow, referred to as a USB cable). According to the first exemplary embodiment, an example is described in which a direct current (DC) power is supplied from the power supply apparatus 100 to the electronic device 200 via the USB cable 400.

The power source 300 is an alternating current (AC) power source (e.g., a commercial power source) or a DC power source (e.g., a battery). The power supply apparatus 100 operates as an AC-DC adapter or an AC-USB adapter when the power source 300 is an AC power source and operates as a DC-DC adapter or a DC-USB adapter when the power source 300 is a DC power source. According to the first exemplary embodiment, an example is described in which the power source 300 is an AC power source, and the power supply apparatus 100 operates as an AC-DC adapter or an AC-USB adapter.

The electronic device 200 operates by power supplied thereto from the power supply apparatus 100 or a battery. The electronic device 200 can operate as, for example, an image capture apparatus (e.g., a digital camera or a digital video camera), a mobile phone (e.g., a smartphone), or both of them.

Next, components in the power supply apparatus 100 are described with reference to FIG. 1. The power supply apparatus 100 may be any of three types of power supply apparatuses (a power supply apparatus A, a power supply apparatus B, and a power supply apparatus C) which have different output capacities but output approximately the same output voltage. The three types of power supply apparatuses (the power supply apparatus A, the power supply apparatus B, and the power supply apparatus C) are described below.

The power supply apparatus 100 includes an AC-DC converter 101, a control unit 102, a voltage detection unit 103, a current detection unit 104, and a connection unit 105 as illustrated in FIG. 1.

The AC-DC converter 101 operates as a voltage conversion unit which converts an AC voltage supplied from the power source 300 to the power supply apparatus 100 to a DC voltage in a predetermined voltage level.

The control unit 102 includes a memory storing a program for controlling each component in the power supply apparatus 100 and a processor for executing the program stored in the memory. The processor of the control unit 102 is, for example, a hardware processor.

The voltage detection unit 103 detects an output voltage of the power supply apparatus 100 and notifies the control unit 102 of a value of the detected output voltage. The current detection unit 104 detects an output current of the power supply apparatus 100 and notifies the control unit 102 of a value of the detected output current.

The connection unit 105 is a connector conforming to the USB standard. The electronic device 200 is connected to the connection unit 105 via the USB cable 400.

Next, components in the electronic device 200 are described with reference to FIG. 1.

The electronic device 200 includes a load unit 201, a control unit 202, a voltage detection unit 203, a current detection unit 204, a storage unit 205, a display unit 206, a DC-DC converter 207, and a connection unit 208 as illustrated in FIG. 1.

The load unit 201 has a configuration for providing a function and a capacity as an image capture apparatus (e.g., a digital camera or a digital video camera), a mobile phone (e.g., a smartphone), or both of them to a user. According to the first exemplary embodiment, an example is described in which the load unit 201 operates as a constant power load.

The DC-DC converter 207 converts the output voltage of the power supply apparatus 100 to a voltage required for operating the load unit 20. The voltage generated by the DC-DC converter 207 is supplied to the load unit 201.

The control unit 202 includes a memory storing a program for controlling each component in the electronic device 200 and a processor for executing the program stored in the memory. The processor of the control unit 202 is, for example, a hardware processor. The programs stored in the memory of the control unit 202 include a program for controlling each component in the electronic device 200 according to a control method illustrated in FIG. 6 and a program for controlling each component in the electronic device 200 according to a control method illustrated in FIG. 7.

The voltage detection unit 203 detects the output voltage of the power supply apparatus 100 and notifies the control unit 202 of a value indicating the detected output voltage (an output voltage value). The current detection unit 204 detects the output current of the power supply apparatus 100 and notifies the control unit 202 of a value indicating the detected output current (an output current value).

The storage unit 205 stores information pieces indicating the three types of power supply apparatuses (the power supply apparatus A, the power supply apparatus B, and the power supply apparatus C) and their output capacities. Information pieces indicating a reference voltage Vsa, a reference voltage Vsb, and a reference voltage Vsc are also stored in the storage unit 205. Information pieces indicating relationships between three types of operation modes (a mode 1, a mode 2, and a mode 3) of the load unit 201 and power consumption of the load unit 201 are also stored in the storage unit 205. Information pieces indicating relationships between three types of operation modes (a sweep 1, a sweep 2, and a sweep 3) of the load unit 201 and power consumption of the load unit 201 are also stored in the storage unit 205.

The display unit 206 is a display device including a liquid crystal panel or an organic electroluminescent (EL) panel and displays predetermined information (e.g., warning information to a user) in response to an instruction from the control unit 202. Information for notifying a user of at least one of the type and the output capacity of the power supply apparatus 100 is also displayed on the display unit 206. Information for notifying a user that the power supply apparatus 100 is an unknown power supply apparatus is also displayed on the display unit 206.

The connection unit 208 is a connector conforming to the USB standard. The power supply apparatus 100 is connected to the connection unit 208 via the USB cable 400.

Figure 2:
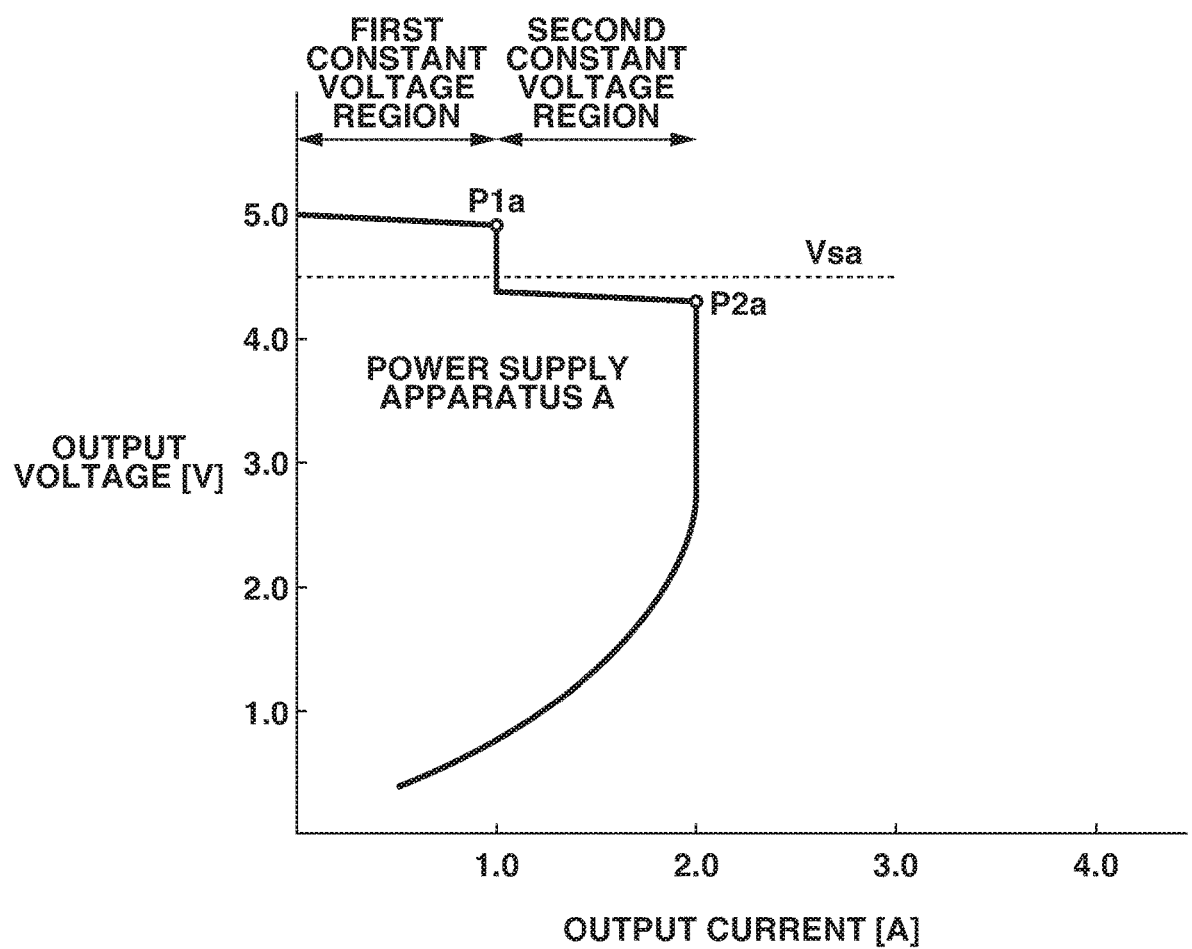
FIG. 2 illustrates a first constant voltage region and a second constant voltage region of a power supply apparatus A.

Next, with reference to FIGS. 2, 3, and 4, an example of relationships between the three types of power supply apparatuses (the power supply apparatus A, the power supply apparatus B, and the power supply apparatus C) which have different output capacities but output approximately the same output voltage and two different operation regions (a first constant voltage region and a second constant voltage region) is described.

FIG. 2 illustrates a first constant voltage region and a second constant voltage region of the power supply apparatus A. An output voltage and an output current illustrated in FIG. 2 are an output voltage and an output current detected by the electronic device 200.

An operation region in which the output voltage of the power supply apparatus A is a first constant voltage (approximately 5 V), and the output current of the power supply apparatus A is within a range from greater than 0 A to 1.0 A or less is defined as the first constant voltage region of the power supply apparatus A. The first constant voltage is dropped by resistance such as the USB cable 400 connecting the power supply apparatus A and the electronic device 200 as illustrated in FIG. 2. A point P1a indicates a maximum output power (approximately 4.9 W) in the first constant voltage region. An output current and an output voltage at the point P1a are respectively 1.0 A and approximately 4.9 V.

An operation region in which the output voltage of the power supply apparatus A is a second constant voltage (approximately 4.4 V), and the output current of the power supply apparatus A is within a range from greater than 1.0 A to 2.0 A or less is defined as the second constant voltage region of the power supply apparatus A. The second constant voltage is dropped by the resistance such as the USB cable 400 connecting the power supply apparatus A and the electronic device 200 as illustrated in FIG. 2. A point P2a indicates a maximum output power (approximately 8.6 W) in the second constant voltage region. An output current and an output voltage at the point P2a are respectively 2.0 A and approximately 4.3 V.

The reference voltage Vsa is a voltage for determining whether the power supply apparatus A operates in the first constant voltage region or in the second constant voltage region. According to the first exemplary embodiment, an example is described in which the reference voltage Vsa is 4.5 V. However, the reference voltage Vsa may be any value within a range from greater than 4.4 V to less than 4.9 V. Information indicating the reference voltage Vsa is stored in the storage unit 205.

FIG. 3 illustrates a first constant voltage region and a second constant voltage region of the power supply apparatus B. An output voltage and an output current illustrated in FIG. 3 are an output voltage and an output current detected by the electronic device 200.

An operation region in which the output voltage of the power supply apparatus B is a first constant voltage (approximately 5 V), and the output current of the power supply apparatus B is within a range from greater than 0 A to 2.0 A or less is defined as the first constant voltage region of the power supply apparatus B. The first constant voltage is dropped by the resistance such as the USB cable 400 connecting the power supply apparatus B and the electronic device 200 as illustrated in FIG. 3. A point P1b indicates a maximum output power (approximately 9.6 W) in the first constant voltage region. An output current and an output voltage at the point P1b are respectively 2.0 A and approximately 4.8 V. A value of the voltage drop by the resistance such as the USB cable 400 fluctuates depending on a type and a condition of the USB cable 400. Thus, the output voltage of the power supply apparatus B operating in the first constant voltage region may be almost the same as the output voltage of the power supply apparatus A operating in the first constant voltage region in some cases.

An operation region in which the output voltage of the power supply apparatus B is a second constant voltage (approximately 4.3 V), and the output current of the power supply apparatus B is in a range from greater than 2.0 A to 3.0 A or less is defined as the second constant voltage region of the power supply apparatus B. The second constant voltage is dropped by the resistance such as the USB cable 400 connecting the power supply apparatus B and the electronic device 200 as illustrated in FIG. 3. A point P2b indicates a maximum output power (approximately 12.6 W) in the second constant voltage region. An output current and an output voltage at the point P2b are respectively 3.0 A and approximately 4.2 V. A value of the voltage drop by the resistance such as the USB cable 400 fluctuates depending on a type and a condition of the USB cable 400. Thus, the output voltage of the power supply apparatus B operating in the second constant voltage region may be almost the same as the output voltage of the power supply apparatus A operating in the second constant voltage region in some cases.

The reference voltage Vsb is a voltage for determining whether the power supply apparatus B operates in the first constant voltage region or in the second constant voltage region. According to the first exemplary embodiment, an example is described in which the reference voltage Vsb is 4.5 V as with the reference voltage Vsa. However, the reference voltage Vsb may be any value within a range from greater than 4.3 V to less than 4.8 V. Information indicating the reference voltage Vsb is stored in the storage unit 205.

FIG. 4 illustrates a first constant voltage region and a second constant voltage region of the power supply apparatus C. An output voltage and an output current illustrated in FIG. 4 are an output voltage and an output current detected by the electronic device 200.

An operation region in which the output voltage of the power supply apparatus C is a first constant voltage (approximately 5 V), and the output current of the power supply apparatus C is within a range from greater than 0 A to 3.0 A or less is defined as the first constant voltage region of the power supply apparatus C. The first constant voltage is dropped by the resistance such as the USB cable 400 connecting the power supply apparatus C and the electronic device 200 as illustrated in FIG. 4. A point P1c indicates a maximum output power (approximately 14.1 W) in the first constant voltage region. An output current and an output voltage at the point P1c are respectively 3.0 A and approximately 4.7 V. A value of the voltage drop by the resistance such as the USB cable 400 fluctuates depending on a type and a condition of the USB cable 400. Thus, the output voltage of the power supply apparatus C operating in the first constant voltage region may be almost the same as the output voltage of the power supply apparatus A or the power supply apparatus B operating in the first constant voltage region in some cases.

An operation region in which the output voltage of the power supply apparatus C is a second constant voltage (approximately 4.2 V), and the output current of the power supply apparatus C is within a range from greater than 3.0 A to 4.0 A or less is defined as the second constant voltage region of the power supply apparatus C. The second constant voltage is dropped by the resistance such as the USB cable 400 connecting the power supply apparatus C and the electronic device 200 as illustrated in FIG. 4. A point P2c indicates a maximum output power (approximately 16.4 W) in the second constant voltage region. An output current and an output voltage at the point P2c are respectively 4.0 A and approximately 4.1 V. A value of the voltage drop by the resistance such as the USB cable 400 fluctuates depending on a type and a condition of the USB cable 400. Thus, the output voltage of the power supply apparatus C operating in the second constant voltage region may be almost the same as the output voltage of the power supply apparatus A or the power supply apparatus B operating in the second constant voltage region in some cases.

The reference voltage Vsc is a voltage for determining whether the power supply apparatus C operates in the first constant voltage region or in the second constant voltage region. According to the first exemplary embodiment, an example is described in which the reference voltage Vsc is 4.5 V as with the reference voltage Vsa. However, the reference voltage Vsc may be any value within a range from greater than 4.2 V to less than 4.7 V. Information indicating the reference voltage Vsc is stored in the storage unit 205.

According to the first exemplary embodiment, the first constant voltage region is regarded as an operation region to be used when the load unit 201 operates as a load which continuously changes. In addition, according to the first exemplary embodiment, the second constant voltage region is regarded as an operation region to be used when the load unit 201 operates as a load which intermittently changes or a pulse load. The second constant voltage region is regarded as the operation region to be used when the load unit 201 operates as the load which intermittently changes or the pulse load, and accordingly heat generation amount of the power supply apparatus A, the power supply apparatus B, or the power supply apparatus C can be reduced.

Next, an example of relationships between the three types of power supply apparatuses (the power supply apparatus A, the power supply apparatus B, and the power supply apparatus C) and respective output capacities is described with reference to FIG. 5A. Information pieces indicating the relationships between the three types of power supply apparatuses (the power supply apparatus A, the power supply apparatus B, and the power supply apparatus C) and the respective output capacities are stored in the storage unit 205.

When the power supply apparatus A operates in the first constant voltage region, the output capacity of the power supply apparatus A is approximately 4.9 W (equal to the maximum output power indicated by the point P1a). When the power supply apparatus A operates in the second constant voltage region, the output capacity of the power supply apparatus A is approximately 8.6 W (equal to the maximum output power indicated by the point P2a). Accordingly, when the power consumption of the load unit 201 is within a range from greater than 0 W to 4.9 W or less, it can be understood that the power supply apparatus A operates in the first constant voltage region. Further, when the power consumption of the load unit 201 is within a range from greater than 4.9 W to 8.6 W or less, it can be understood that the power supply apparatus A operates in the second constant voltage region.

When the power supply apparatus B operates in the first constant voltage region, the output capacity of the power supply apparatus B is approximately 9.6 W (equal to the maximum output power indicated by the point P1b). When the power supply apparatus B operates in the second constant voltage region, the output capacity of the power supply apparatus B is approximately 12.6 W (equal to the maximum output power indicated by the point P2b). Accordingly, when the power consumption of the load unit 201 is within a range from greater than 0 W to 9.6 W or less, it can be understood that the power supply apparatus B operates in the first constant voltage region. Further, when the power consumption of the load unit 201 is within a range from greater than 9.6 W to 12.6 W or less, it can be understood that the power supply apparatus B operates in the second constant voltage region.

When the power supply apparatus C operates in the first constant voltage region, the output capacity of the power supply apparatus C is approximately 14.1 W (equal to the maximum output power indicated by the point P1c). When the power supply apparatus C operates in the second constant voltage region, the output capacity of the power supply apparatus C is approximately 16.4 W (equal to the maximum output power indicated by the point P2c). Accordingly, when the power consumption of the load unit 201 is within a range from greater than 0 W to 14.1 W or less, it can be understood that the power supply apparatus C operates in the first constant voltage region. Further, when the power consumption of the load unit 201 is within a range from greater than 14.1 W to 16.4 W or less, it can be understood that the power supply apparatus C operates in the second constant voltage region.

Next, a first example of the relationships between the three types of operation modes (the mode 1, the mode 2, and the mode 3) of the load unit 201 operating as a constant power load and the power consumption of the load unit 201 is described with reference to FIG. 5B. The information pieces indicating the relationships between the three types of operation modes (the mode 1, the mode 2, and the mode 3) of the load unit 201 and the respective power consumption of the load unit 201 are stored in the storage unit 20.

When the load unit 201 operates in the mode 1, the power consumption of the load unit 201 is, for example, 6.8 W. In the case where the power supply apparatus 100 is the power supply apparatus A when the load unit 201 operates in the mode 1, the power consumption of the load unit 201 (6.8 W) exceeds the power at the point P1a (approximately 4.9 W) but does not exceed the power at the point P2a (approximately 8.6 W). Thus, in this case, the power supply apparatus 100 as the power supply apparatus A operates within the second constant voltage region.

In the case where the power supply apparatus 100 is the power supply apparatus B when the load unit 201 operates in the mode 1, the power consumption of the load unit 201 (6.8 W) does not exceed the power at the point P1b (approximately 9.6 W). Thus, in this case, the power supply apparatus 100 as the power supply apparatus B operates within the first constant voltage region.

In the case where the power supply apparatus 100 is the power supply apparatus C when the load unit 201 operates in the mode 1, the power consumption of the load unit 201 (6.8 W) does not exceed the power at the point P1c (approximately 14.1 W). Thus, in this case, the power supply apparatus 100 as the power supply apparatus C operates within the first constant voltage region.

When the load unit 201 operates in the mode 2, the power consumption of the load unit 201 is, for example, 11.1 W. In the case where the power supply apparatus 100 is the power supply apparatus A when the load unit 201 operates in the mode 2, the power consumption of the load unit 201 (11.1 W) exceeds the power at the point P2a (approximately 8.6 W). Thus, in this case, the power supply apparatus 100 as the power supply apparatus A stops the operation.

In the case where the power supply apparatus 100 is the power supply apparatus B when the load unit 201 operates in the mode 2, the power consumption of the load unit 201 (11.1 W) exceeds the power at the point P1b (approximately 9.6 W) but does not exceed the power at the point P2b (approximately 12.6 W). Thus, in this case, the power supply apparatus 100 as the power supply apparatus B operates within the second constant voltage region.

In the case where the power supply apparatus 100 is the power supply apparatus C when the load unit 201 operates in the mode 2, the power consumption of the load unit 201 (11.1 W) does not exceed the power at the point P1c (approximately 14.1 W). Thus, in this case, the power supply apparatus 100 as the power supply apparatus C operates within the first constant voltage region.

When the electronic device 200 operates in the mode 3, the power consumption of the load unit 201 is, for example, 15.3 W. In the case where the power supply apparatus 100 is the power supply apparatus A when the load unit 201 operates in the mode 3, the power consumption of the load unit 201 (15.3 W) exceeds the power at the point P2a (approximately 8.6 W). Thus, in this case, the power supply apparatus 100 as the power supply apparatus A stops the operation.

In the case where the power supply apparatus 100 is the power supply apparatus B when the load unit 201 operates in the mode 3, the power consumption of the load unit 201 (15.3 W) exceeds the power at the point P2b (approximately 12.6 W). Thus, in this case, the power supply apparatus 100 as the power supply apparatus B stops the operation.

In the case where the power supply apparatus 100 is the power supply apparatus C when the load unit 201 operates in the mode 3, the power consumption of the load unit 201 (15.3 W) exceeds the power at the point P1c (approximately 14.1 W) but does not exceed the power at the point P2c (approximately 16.4 W). Thus, in this case, the power supply apparatus 100 as the power supply apparatus C operates within the second constant voltage region.

Next, an example of a control method of the electronic device 200 according to the first exemplary embodiment is described with reference to a flowchart in FIG. 6. Processes in the flowchart in FIG. 6 are started, for example, when the power supply apparatus 100 is connected to the electronic device 200.

In step S601, the control unit 202 instructs the load unit 201 to operate in the mode 1. The power consumption of the load unit 201 operating in the mode 1 is, for example, 6.8 W.

In step S602, the control unit 202 instructs the voltage detection unit 203 to detect the output voltage of the power supply apparatus 100 and the current detection unit 204 to detect the output current of the power supply apparatus 100. Accordingly, the control unit 202 obtains the output voltage value indicating the output voltage of the power supply apparatus 100 from the voltage detection unit 203 and the output current value indicating the output current of the power supply apparatus 100 from the current detection unit 204.

In step S603, the control unit 202 assumes that the power supply apparatus 100 is the power supply apparatus A and determines whether the power supply apparatus 100 operates within the second constant voltage region. When the output voltage value obtained in step S602 exceeds the reference voltage Vsa, and the output current value obtained in step S602 is in the range from greater than 1.0 A to 2.0 A or less, the control unit 202 determines that the power supply apparatus 100 operates within the second constant voltage region. In this case (YES in step S603), the control unit 202 advances the process to step S604. When the output voltage value obtained in step S602 does not exceed the reference voltage Vsa, the control unit 202 determines that the power supply apparatus 100 does not operate within the second constant voltage region regardless of the output current value. In this case (NO in step S603), the control unit 202 advances the process to step S605. When the output current value obtained in step S602 is not in the range from greater than 1.0 A to 2.0 A or less, the control unit 202 determines that the power supply apparatus 100 does not operate within the second constant voltage region regardless of the output voltage value. In this case (NO in step S603), the control unit 202 advances the process to step S605.

Determination of whether the power supply apparatus 100 assumed as the power supply apparatus A operates within the second constant voltage region is not limited to the above-described determination method. For example, instead of the above-described determination method, a determination method may be adopted in which only the output voltage value is used in the output voltage value and the output current value obtained in step S602. In this case, when the output voltage value obtained in step S602 exceeds the reference voltage Vsa, it is determined that the power supply apparatus 100 operates within the second constant voltage region (YES in step S603). When the output voltage value obtained in step S602 does not exceed the reference voltage Vsa, it is determined that the power supply apparatus 100 does not operate within the second constant voltage region (NO in step S603).

In step S604, the control unit 202 determines that the power supply apparatus 100 is the power supply apparatus A. The control unit 202 further determines that the output capacity of the power supply apparatus 100 operating within the first constant voltage region is approximately 4.9 W, and the output capacity of the power supply apparatus 100 operating within the second constant voltage region is approximately 8.6 W by referring to the information stored in the storage unit 205. Subsequently, the control unit 202 controls the operation of the load unit 201 on the assumption that the power supply apparatus 100 is the power supply apparatus A. In step S604, the control unit 202 may display information for notifying a user of at least one of the type and the output capacity of the power supply apparatus 100 on the display unit 206.

In step S605, the control unit 202 instructs the load unit 201 to operate in the mode 2. The power consumption of the load unit 201 operating in the mode 2 is, for example, 11.1 W.

In step S606, the control unit 202 instructs the voltage detection unit 203 to detect the output voltage of the power supply apparatus 100 and the current detection unit 204 to detect the output current of the power supply apparatus 100. Accordingly, the control unit 202 obtains the output voltage value indicating the output voltage of the power supply apparatus 100 from the voltage detection unit 203 and the output current value indicating the output current of the power supply apparatus 100 from the current detection unit 204.

In step S607, the control unit 202 assumes that the power supply apparatus 100 is the power supply apparatus B and determines whether the power supply apparatus 100 operates within the second constant voltage region. When the output voltage value obtained in step S606 exceeds the reference voltage Vsb, and the output current value obtained in step S606 is in the range from greater than 2.0 A to 3.0 A or less, the control unit 202 determines that the power supply apparatus 100 operates within the second constant voltage region. In this case (YES in step S607), the control unit 202 advances the process to step S608. When the output voltage value obtained in step S606 does not exceed the reference voltage Vsb, the control unit 202 determines that the power supply apparatus 100 does not operate within the second constant voltage region regardless of the output current value. In this case (NO in step S607), the control unit 202 advances the process to step S609. When the output current value obtained in step S606 is not in the range from greater than 2.0 A to 3.0 A or less, the control unit 202 determines that the power supply apparatus 100 does not operate within the second constant voltage region regardless of the output voltage value. In this case (NO in step S607), the control unit 202 advances the process to step S609.

Determination of whether the power supply apparatus 100 assumed as the power supply apparatus B operates within the second constant voltage region is not limited to the above-described determination method. For example, instead of the above-described determination method, a determination method may be adopted in which only the output voltage value is used in the output voltage value and the output current value obtained in step S606. In this case, when the output voltage value obtained in step S606 exceeds the reference voltage Vsb, it is determined that the power supply apparatus 100 operates within the second constant voltage region (YES in step S607). When the output voltage value obtained in step S606 does not exceed the reference voltage Vsb, it is determined that the power supply apparatus 100 does not operate within the second constant voltage region (NO in step S607).

In step S608, the control unit 202 determines that the power supply apparatus 100 is the power supply apparatus B. The control unit 202 further determines that the output capacity of the power supply apparatus 100 operating within the first constant voltage region is approximately 9.6 W, and the output capacity of the power supply apparatus 100 operating within the second constant voltage region is approximately 12.6 W by referring to the information stored in the storage unit 205. Subsequently, the control unit 202 controls the operation of the load unit 201 on the assumption that the power supply apparatus 100 is the power supply apparatus B. In step S608, the control unit 202 may display the information for notifying a user of at least one of the type and the output capacity of the power supply apparatus 100 on the display unit 206.

In step S609, the control unit 202 instructs the load unit 201 to operate in the mode 3. The power consumption of the load unit 201 operating in the mode 3 is, for example, 15.3 W.

In step S610, the control unit 202 instructs the voltage detection unit 203 to detect the output voltage of the power supply apparatus 100 and the current detection unit 204 to detect the output current of the power supply apparatus 100. Accordingly, the control unit 202 obtains the output voltage value indicating the output voltage of the power supply apparatus 100 from the voltage detection unit 203 and the output current value indicating the output current of the power supply apparatus 100 from the current detection unit 204.

In step S611, the control unit 202 assumes that the power supply apparatus 100 is the power supply apparatus C and determines whether the power supply apparatus 100 operates within the second constant voltage region. When the output voltage value obtained in step S610 exceeds the reference voltage Vsc, and the output current value obtained in step S610 is in the range from greater than 3.0 A to 4.0 A or less, the control unit 202 determines that the power supply apparatus 100 operates within the second constant voltage region. In this case (YES in step S611), the control unit 202 advances the process to step S612. When the output voltage value obtained in step S610 does not exceed the reference voltage Vsc, the control unit 202 determines that the power supply apparatus 100 does not operate within the second constant voltage region regardless of the output current value. In this case (NO in step S611), the control unit 202 advances the process to step S613. When the output current value obtained in step S610 is not in the range from greater than 3.0 A to 4.0 A or less, the control unit 202 determines that the power supply apparatus 100 does not operate within the second constant voltage region regardless of the output voltage value. In this case (NO in step S611), the control unit 202 advances the process to step S613.

Determination of whether the power supply apparatus 100 assumed as the power supply apparatus C operates within the second constant voltage region is not limited to the above-described determination method. For example, instead of the above-described determination method, a determination method may be adopted in which only the output voltage value is used in the output voltage value and the output current value obtained in step S610. In this case, when the output voltage value obtained in step S610 exceeds the reference voltage Vsc, it is determined that the power supply apparatus 100 operates within the second constant voltage region (YES in step S611). When the output voltage value obtained in step S610 does not exceed the reference voltage Vsc, it is determined that the power supply apparatus 100 does not operate within the second constant voltage region (NO in step S611).

In step S612, the control unit 202 determines that the power supply apparatus 100 is the power supply apparatus C. The control unit 202 further determines that the output capacity of the power supply apparatus 100 operating within the first constant voltage region is approximately 14.1 W, and the output capacity of the power supply apparatus 100 operating within the second constant voltage region is approximately 16.4 W by referring to the information stored in the storage unit 205. Subsequently, the control unit 202 controls the operation of the load unit 201 on the assumption that the power supply apparatus 100 is the power supply apparatus C. In step S612, the control unit 202 may display the information for notifying a user of at least one of the type and the output capacity of the power supply apparatus 100 on the display unit 206.

In step S613, the control unit 202 determines that the power supply apparatus 100 is a power supply apparatus of which a type and an output capacity are unknown, stops the operation of the load unit 201, and shifts the electronic device 200 to a power-off state. In step S613, the control unit 202 may display information notifying a user that the power supply apparatus 100 is an unknown power supply apparatus on the display unit 206 until a predetermined time passes before shifting the electronic device 200 to the power-off state.

As described above, when the power supply apparatus 100 is any of the above-described three types of power supply apparatuses, the electronic device 200 according to the first exemplary embodiment can determine the type and the output capacity of the power supply apparatus 100 without communicating with the power supply apparatus 100.

Further, the electronic device 200 according to the first exemplary embodiment can determine the type and the output capacity of the power supply apparatus 100 even if the power supply apparatus 100 is a power supply apparatus which cannot communicate with the electronic device 200 via the USB since a D+ line and a D− line are short-circuited.

If the power supply apparatus 100 is the power supply apparatus which can communicate with the electronic device 200 via the USB, the electronic device 200 may perform the control method illustrated in FIG. 6 before starting communication with the power supply apparatus 100 via the USB. Accordingly, the electronic device 200 can determine the type and the output capacity of the power supply apparatus 100 without communicating with the power supply apparatus 100. In addition, the electronic device 200 can determine the type and the output capacity of the power supply apparatus 100 in a period shorter than a period in which the electronic device 200 starts communication with the power supply apparatus 100 and determines the type or the output capacity of the power supply apparatus 100.

Second Exemplary Embodiment

According to the first exemplary embodiment, the example is described in which the power consumption of the load unit 201 used for determining whether the power supply apparatus 100 operates within the first constant voltage region or within the second constant voltage region is a fixed value (see FIG. 5B).

In contrast, according to a second exemplary embodiment, an example is described in which the power consumption of the load unit 201 used for determining whether the power supply apparatus 100 operates within the first constant voltage region or within the second constant voltage region is a value which changes in a stepwise manner. The power consumption of the load unit 201 is changed in a stepwise manner, and thus determination accuracy of whether the power supply apparatus 100 operates within the first constant voltage region or within the second constant voltage region can be improved.

According to the second exemplary embodiment, an example is described in which the number of times that the power consumption of the load unit 201 is changed during a sweep operation is four times, however, the number of times that the power consumption of the load unit 201 is changed during the sweep operation is not limited to four times. As the number of times that the power consumption of the load unit 201 is changed during the sweep operation is increased, the type and the output capacity of the power supply apparatus 100 can be determined in higher accuracy.

FIG. 1 illustrates an example of a system configuration according to the second exemplary embodiment. The example of the system configuration according to the second exemplary embodiment is similar to that of the first exemplary embodiment, and thus the description thereof is omitted. The components of the power supply apparatus 100 according to the second exemplary embodiment are also similar to those of the first exemplary embodiment, and thus the descriptions thereof are omitted. The components of the electronic device 200 according to the second exemplary embodiment are also similar to those of the first exemplary embodiment, and thus the descriptions thereof are omitted.

Next, a second example of the relationships between the three types of operation modes (the sweep 1, the sweep 2, and the sweep 3) of the load unit 201 operating as the constant power load and the power consumption of the load unit 201 is described with reference to FIG. 5C. The information pieces indicating the relationships between the three types of operation modes (the sweep 1, the sweep 2, and the sweep 3) of the load unit 201 and the respective power consumption of the load unit 201 are also stored in the storage unit 205.

An operation mode in which the load unit 201 performs the sweep operation for changing the power consumption in a range from 3.9 W to 5.9 W in a stepwise manner is referred to as the sweep 1. According to the second exemplary embodiment, an example is described in which the power consumption of the load unit 201 operating in the sweep 1 is changed four times in the order of from 3.9 W to 4.4 W, from 4.4 W to 4.9 W, from 4.9 W to 5.4 W, and from 5.4 W to 5.9 W.

An operation mode in which the load unit 201 performs the sweep operation for changing the power consumption in a range from 8.1 W to 11.1 W in a stepwise manner is referred to as the sweep 2. According to the second exemplary embodiment, an example is described in which the power consumption of the load unit 201 operating in the sweep 2 is changed four times in the order of from 8.1 W to 8.85 W, from 8.85 W to 9.6 W, from 9.6 W to 10.35 W, and from 10.35 W to 11.1 W.

An operation mode in which the load unit 201 performs the sweep operation for changing the power consumption in a range from 12.1 W to 16.1 W in a stepwise manner is referred to as the sweep 3. According to the second exemplary embodiment, an example is described in which the power consumption of the load unit 201 operating in the sweep 3 is changed four times in the order of from 12.1 W to 13.1 W, from 13.1 W to 14.1 W, from 14.1 W to 15.1 W, and from 15.1 W to 16.1 W.

Figure 7:
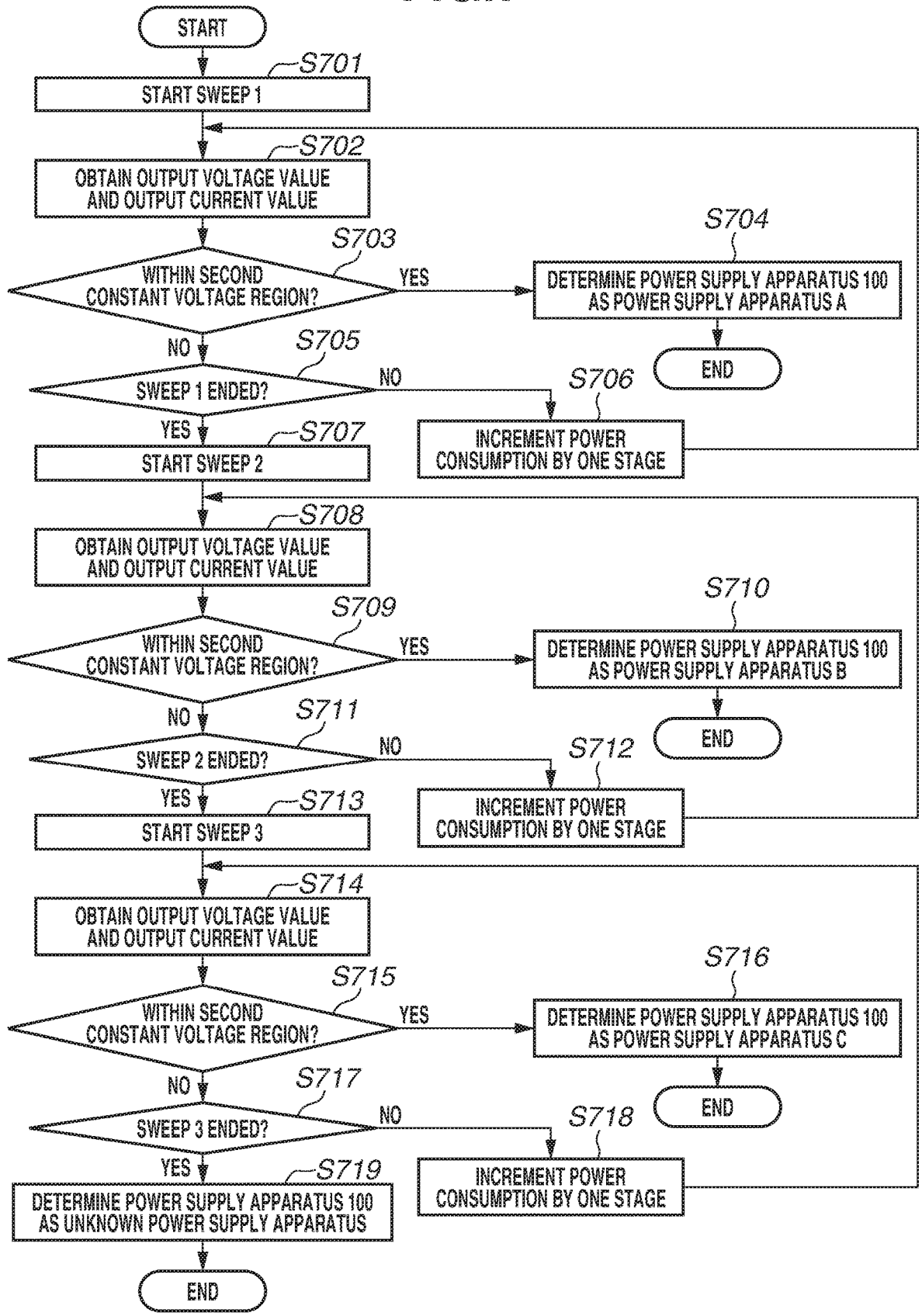
FIG. 7 is a flowchart illustrating an example of a control method of an electronic device according to a second exemplary embodiment.

Next, an example of a control method of the electronic device 200 according to the second exemplary embodiment is described with reference to a flowchart in FIG. 7. Processes in the flowchart in FIG. 7 are started, for example, when the power supply apparatus 100 is connected to the electronic device 200.

In step S701, the control unit 202 instructs the load unit 201 to start the sweep 1. The power consumption of the load unit 201 when starting the sweep 1 is 3.9 W. The power consumption of the load unit 201 operating in the sweep 1 is changed in a stepwise manner every time the process in step S706 is performed. More specifically, the power consumption is changed four times in the order of from 3.9 W to 4.4 W, from 4.4 W to 4.9 W, from 4.9 W to 5.4 W, and from 5.4 W to 5.9 W.

In step S702, the control unit 202 instructs the voltage detection unit 203 to detect the output voltage of the power supply apparatus 100 and the current detection unit 204 to detect the output current of the power supply apparatus 100. Accordingly, the control unit 202 obtains the output voltage value indicating the output voltage of the power supply apparatus 100 from the voltage detection unit 203 and the output current value indicating the output current of the power supply apparatus 100 from the current detection unit 204.

In step S703, the control unit 202 assumes that the power supply apparatus 100 is the power supply apparatus A and determines whether the power supply apparatus 100 operates within the second constant voltage region. When the output voltage value obtained in step S702 exceeds the reference voltage Vsa, and the output current value obtained in step S702 is in the range from greater than 1.0 A to 2.0 A or less, the control unit 202 determines that the power supply apparatus 100 operates within the second constant voltage region. In this case (YES in step S703), the control unit 202 advances the process to step S704. When the output voltage value obtained in step S702 does not exceed the reference voltage Vsa, the control unit 202 determines that the power supply apparatus 100 does not operate within the second constant voltage region regardless of the output current value. In this case (NO in step S703), the control unit 202 advances the process to step S705. When the output current value obtained in step S702 is not in the range from greater than 1.0 A to 2.0 A or less, the control unit 202 determines that the power supply apparatus 100 does not operate within the second constant voltage region regardless of the output voltage value. In this case (NO in step S703), the control unit 202 advances the process to step S705.

Determination of whether the power supply apparatus 100 assumed as the power supply apparatus A operates within the second constant voltage region is not limited to the above-described determination method. For example, instead of the above-described determination method, a determination method may be adopted in which only the output voltage value is used in the output voltage value and the output current value obtained in step S702. In this case, when the output voltage value obtained in step S702 exceeds the reference voltage Vsa, it is determined that the power supply apparatus 100 operates within the second constant voltage region (YES in step S703). When the output voltage value obtained in step S702 does not exceed the reference voltage Vsa, it is determined that the power supply apparatus 100 does not operate within the second constant voltage region (NO in step S703).

In step S704, the control unit 202 determines that the power supply apparatus 100 is the power supply apparatus A. The control unit 202 further determines that the output capacity of the power supply apparatus 100 operating within the first constant voltage region is approximately 4.9 W, and the output capacity of the power supply apparatus 100 operating within the second constant voltage region is approximately 8.6 W by referring to the information stored in the storage unit 205. Subsequently, the control unit 202 controls the operation of the load unit 201 on the assumption that the power supply apparatus 100 is the power supply apparatus A. In step S704, the control unit 202 may display the information for notifying a user of at least one of the type and the output capacity of the power supply apparatus 100 on the display unit 206.

In step S705, the control unit 202 determines whether the power consumption of the load unit 201 reaches 5.9 W. When the power consumption of the load unit 201 does not reach 5.9 W (NO in step S705), the control unit 202 advances the process to step S706. When the power consumption of the load unit 201 reaches 5.9 W (YES in step S705), the control unit 202 instructs the load unit 201 to end the sweep 1 and advances the process to step S707.

In step S706, the control unit 202 instructs the load unit 201 to increment the power consumption of the load unit 201 by one stage (corresponding to 0.5 W). After the power consumption of the load unit 201 is incremented by one stage (corresponding to 0.5 W), the control unit 202 returns the process to step S702.

In step S707, the control unit 202 instructs the load unit 201 to start the sweep 2. The power consumption of the load unit 201 when starting the sweep 2 is 8.1 W. The power consumption of the load unit 201 operating in the sweep 2 is changed in a stepwise manner every time the process in step S712 is performed. More specifically, the power consumption is changed four times in the order of from 8.1 W to 8.85 W, from 8.85 W to 9.6 W, from 9.6 W to 10.35 W, and from 10.35 W to 11.1 W.

In step S708, the control unit 202 instructs the voltage detection unit 203 to detect the output voltage of the power supply apparatus 100 and the current detection unit 204 to detect the output current of the power supply apparatus 100. Accordingly, the control unit 202 obtains the output voltage value indicating the output voltage of the power supply apparatus 100 from the voltage detection unit 203 and the output current value indicating the output current of the power supply apparatus 100 from the current detection unit 204.

In step S709, the control unit 202 assumes that the power supply apparatus 100 is the power supply apparatus B and determines whether the power supply apparatus 100 operates within the second constant voltage region. When the output voltage value obtained in step S708 exceeds the reference voltage Vsb, and the output current value obtained in step S708 is in the range from greater than 2.0 A to 3.0 A or less, the control unit 202 determines that the power supply apparatus 100 operates within the second constant voltage region. In this case (YES in step S709), the control unit 202 advances the process to step S710. When the output voltage value obtained in step S708 does not exceed the reference voltage Vsb, the control unit 202 determines that the power supply apparatus 100 does not operate within the second constant voltage region regardless of the output current value. In this case (NO in step S709), the control unit 202 advances the process to step S711. When the output current value obtained in step S708 is not in the range from greater than 2.0 A to 3.0 A or less, the control unit 202 determines that the power supply apparatus 100 does not operate within the second constant voltage region regardless of the output voltage value. In this case (NO in step S709), the control unit 202 advances the process to step S711.

Determination of whether the power supply apparatus 100 assumed as the power supply apparatus B operates within the second constant voltage region is not limited to the above-described determination method. For example, instead of the above-described determination method, a determination method may be adopted in which only the output voltage value is used in the output voltage value and the output current value obtained in step S708. In this case, when the output voltage value obtained in step S708 exceeds the reference voltage Vsb, it is determined that the power supply apparatus 100 operates within the second constant voltage region (YES in step S709). When the output voltage value obtained in step S708 does not exceed the reference voltage Vsb, it is determined that the power supply apparatus 100 does not operate within the second constant voltage region (NO in step S709).

In step S710, the control unit 202 determines that the power supply apparatus 100 is the power supply apparatus B. The control unit 202 further determines that the output capacity of the power supply apparatus 100 operating within the first constant voltage region is approximately 9.6 W, and the output capacity of the power supply apparatus 100 operating within the second constant voltage region is approximately 12.6 W by referring to the information stored in the storage unit 205. Subsequently, the control unit 202 controls the operation of the load unit 201 on the assumption that the power supply apparatus 100 is the power supply apparatus B. In step S710, the control unit 202 may display the information for notifying a user of at least one of the type and the output capacity of the power supply apparatus 100 on the display unit 206.

In step S711, the control unit 202 determines whether the power consumption of the load unit 201 reaches 11.1 W. When the power consumption of the load unit 201 does not reach 11.1 W (NO in step S711), the control unit 202 advances the process to step S712. When the power consumption of the load unit 201 reaches 11.1 W (YES in step S711), the control unit 202 instructs the load unit 201 to end the sweep 2 and advances the process to step S713.

In step S712, the control unit 202 instructs the load unit 201 to increment the power consumption of the load unit 201 by one stage (corresponding to 0.75 W). After the power consumption of the load unit 201 is incremented by one stage (corresponding to 0.75 W), the control unit 202 returns the process to step S708.

In step S713, the control unit 202 instructs the load unit 201 to start the sweep 3. The power consumption of the load unit 201 when starting the sweep 3 is 12.1 W. The power consumption of the load unit 201 operating in the sweep 3 is changed in a stepwise manner every time the process in step S718 is performed. More specifically, the power consumption is changed four times in the order of from 12.1 W to 13.1 W, from 13.1 W to 14.1 W, from 14.1 W to 15.1 W, and from 15.1 W to 16.1 W.

In step S714, the control unit 202 instructs the voltage detection unit 203 to detect the output voltage of the power supply apparatus 100 and the current detection unit 204 to detect the output current of the power supply apparatus 100. Accordingly, the control unit 202 obtains the output voltage value indicating the output voltage of the power supply apparatus 100 from the voltage detection unit 203 and the output current value indicating the output current of the power supply apparatus 100 from the current detection unit 204.

In step S715, the control unit 202 assumes that the power supply apparatus 100 is the power supply apparatus C and determines whether the power supply apparatus 100 operates within the second constant voltage region. When the output voltage value obtained in step S714 exceeds the reference voltage Vsc, and the output current value obtained in step S714 is in the range from greater than 3.0 A to 4.0 A or less, the control unit 202 determines that the power supply apparatus 100 operates within the second constant voltage region. In this case (YES in step S715), the control unit 202 advances the process to step S716. When the output voltage value obtained in step S714 does not exceed the reference voltage Vsc, the control unit 202 determines that the power supply apparatus 100 does not operate within the second constant voltage region regardless of the output current value. In this case (NO in step S715), the control unit 202 advances the process to step S717. When the output current value obtained in step S714 is not in the range from greater than 3.0 A to 4.0 A or less, the control unit 202 determines that the power supply apparatus 100 does not operate within the second constant voltage region regardless of the output voltage value. In this case (NO in step S715), the control unit 202 advances the process to step S717.

Determination of whether the power supply apparatus 100 assumed as the power supply apparatus C operates within the second constant voltage region is not limited to the above-described determination method. For example, instead of the above-described determination method, a determination method may be adopted in which only the output voltage value is used in the output voltage value and the output current value obtained in step S714. In this case, when the output voltage value obtained in step S714 exceeds the reference voltage Vsc, it is determined that the power supply apparatus 100 operates within the second constant voltage region (YES in step S715). When the output voltage value obtained in step S714 does not exceed the reference voltage Vsc, it is determined that the power supply apparatus 100 does not operate within the second constant voltage region (NO in step S715).

In step S716, the control unit 202 determines that the power supply apparatus 100 is the power supply apparatus C. The control unit 202 further determines that the output capacity of the power supply apparatus 100 operating within the first constant voltage region is approximately 14.1 W, and the output capacity of the power supply apparatus 100 operating within the second constant voltage region is approximately 16.4 W by referring to the information stored in the storage unit 205. Subsequently, the control unit 202 controls the operation of the load unit 201 on the assumption that the power supply apparatus 100 is the power supply apparatus C. In step S716, the control unit 202 may display the information for notifying a user of at least one of the type and the output capacity of the power supply apparatus 100 on the display unit 206.

In step S717, the control unit 202 determines whether the power consumption of the load unit 201 reaches 16.1 W. When the power consumption of the load unit 201 does not reach 16.1 W (NO in step S717), the control unit 202 advances the process to step S718. When the power consumption of the load unit 201 reaches 16.1 W (YES in step S717), the control unit 202 instructs the load unit 201 to end the sweep 3 and advances the process to step S719.

In step S718, the control unit 202 instructs the load unit 201 to increment the power consumption of the load unit 201 by one stage (corresponding to 1 W). After the power consumption of the load unit 201 is incremented by one stage (corresponding to 1 W), the control unit 202 returns the process to step S714.

In step S719, the control unit 202 determines that the power supply apparatus 100 is a power supply apparatus of which a type and an output capacity are unknown, stops the operation of the load unit 201, and shifts the electronic device 200 to the power-off state. In step S719, the control unit 202 may display the information notifying a user that the power supply apparatus 100 is an unknown power supply apparatus on the display unit 206 until a predetermined time passes before shifting the electronic device 200 to the power-off state.

As described above, the electronic device 200 according to the second exemplary embodiment can determine the type and the output capacity of the power supply apparatus 100 in the accuracy higher than that of the first exemplary embodiment by performing the above-described three types of sweep operations without communicating with the power supply apparatus 100.

Further, the electronic device 200 according to the second exemplary embodiment can determine the type and the output capacity of the power supply apparatus 100 even if the power supply apparatus 100 is a power supply apparatus which cannot communicate with the electronic device 200 via the USB since a D+ line and a D− line are short-circuited.

If the power supply apparatus 100 is the power supply apparatus which can communicate with the electronic device 200 via the USB, the electronic device 200 may perform the control method illustrated in FIG. 7 before starting communication with the power supply apparatus 100 via the USB. Accordingly, the electronic device 200 can determine the type and the output capacity of the power supply apparatus 100 without communicating with the power supply apparatus 100. In addition, the electronic device 200 can determine the type and the output capacity of the power supply apparatus 100 in a period shorter than a period in which the electronic device 200 starts communication with the power supply apparatus 100 and determines the type or the output capacity of the power supply apparatus 100.

Third Exemplary Embodiment

Various functions, processes, or methods described according to the first and the second exemplary embodiments can be realized by a personal computer, a microcomputer, a central processing unit (CPU), a processor, and the like using a program. According to a third exemplary embodiment, a personal computer, a microcomputer, a CPU, a processor, and the like are referred to as a "computer X". Further, according to the third exemplary embodiment, a program for controlling the computer X and for realizing the various functions, processes, or methods described according to the first and the second exemplary embodiments is referred to as a "program Y".

The various functions, processes, or methods described according to the first and the second exemplary embodiments are realized by the computer X executing the program Y. In this case, the program Y is provided to the computer X via a computer-readable storage medium. The computer-readable storage medium according to the third exemplary embodiment includes at least one of a hard disk device, a magnetic storage device, an optical storage device, a magneto-optical storage device, a memory card, a volatile memory, and a nonvolatile memory. The computer-readable storage medium according to the third exemplary embodiment is a non-transitory storage medium.

Exemplary embodiments of the disclosure are not limited to the above-described first, second, and third exemplary embodiments. The first, second, and third exemplary embodiments which are modified or altered in a range not departing from the scope of the disclosure can be included in the exemplary embodiments of the disclosure.

While aspects of the disclosure are described with reference to exemplary embodiments, it is to be understood that the aspects of the disclosure are not limited to the exemplary embodiments. The scope of the following claims is to be accorded the broadest interpretation so as to encompass all modifications and equivalent structures.

This application claims priority from Japanese Patent Application No. 2017-108281, filed May 31, 2017, which is hereby incorporated by reference herein in its entirety.

What is claimed is:

1. A device comprising:
    a connection unit that is connected to a power supply apparatus;
    a load unit that operates as a constant power load;
    a voltage detection unit that detects a first output voltage of the power supply apparatus in a case where the load unit operates in a first operation mode, and detects a second output voltage of the power supply apparatus in a case where the load unit operates in a second operation mode after the first output voltage of the power supply apparatus is detected; and
    a determination unit that determines a type or an output capacity of the power supply apparatus, based on the detected first output voltage, and determines a type or an output capacity of the power supply apparatus, based on the detected second output voltage, in a case where a type or an output capacity of the power supply apparatus is not able to be determined based on the detected first output voltage.

2. The device according to claim 1, further comprising a current detection unit that detects a first output current of the power supply apparatus in a case where the load unit operates in the first operation mode, and detects a second output current of the power supply apparatus in a case where the load unit operates in the second operation mode after the first output current of the power supply apparatus is detected,
    wherein the determination unit determines a type or an output capacity of the power supply apparatus, based on the detected first output voltage and the detected first output current, and determines a type or an output capacity of the power supply apparatus, based on the detected second output voltage and the detected second output current, in a case where a type or an output capacity of the power supply apparatus is not determined based on the detected first output voltage and the detected first output current.

3. The device according to claim 1, wherein the load unit changes power consumption of the load unit in a stepwise manner from first power consumption in a case where the load unit operates in the first operation mode, and
    wherein the load unit changes the power consumption of the load unit in a stepwise manner from second power consumption different from the first power consumption in the case where the load unit operates in the second operation mode after the first output voltage of the power supply apparatus is detected.

4. The device according to claim 1, wherein the load unit increases power consumption of the load unit in a stepwise manner from first power consumption in a case where the load unit operates in the first operation mode, and
    wherein the load unit increases the power consumption of the load unit in a stepwise manner from second power consumption different from the first power consumption in the case where the load unit operates in the second operation mode after the first output voltage of the power supply apparatus is detected.

5. The device according to claim 1, further comprising a display unit that displays information for notifying a user of a type or an output capacity of the power supply apparatus.

6. The device according to claim 1, wherein the load unit stops operating in the first operation mode or the second operation mode, in a case where a type or an output capacity of the power supply apparatus is not determined based on the detected first output voltage and the detected second output voltage.

7. A method of controlling a device including a connection unit that is connected to a power supply apparatus and a load unit that operates as a constant power load, the method comprising:
- detecting a first output voltage of the power supply apparatus in a case where the load unit operates in a first operation mode;
- detecting a second output voltage of the power supply apparatus in a case where the load unit operates in a second operation mode after the first output voltage of the power supply apparatus is detected;
- determining a type or an output capacity of the power supply apparatus, based on the detected first output voltage; and
- determining a type or an output capacity of the power supply apparatus, based on the detected second output voltage, in a case where a type or an output capacity of the power supply apparatus is not able to be determined based on the detected first output voltage.

8. The method according to claim 7, further comprising:
- detecting a first output current of the power supply apparatus in a case where the load unit operates in the first operation mode; and
- detecting a second output current of the power supply apparatus in a case where the load unit operates in the second operation mode after the first output current of the power supply apparatus is detected,
- wherein a type or an output capacity of the power supply apparatus is determined based on the detected first output voltage and the detected first output current, and
- wherein a type or an output capacity of the power supply apparatus is determined based on the detected second output voltage and the detected second output current, in a case where a type or an output capacity of the power supply apparatus is not determined based on the detected first output voltage and the detected first output current.

9. The method according to claim 7, wherein the load unit changes power consumption of the load unit in a stepwise manner from first power consumption in a case where the load unit operates in the first operation mode, and
- wherein the load unit changes the power consumption of the load unit in a stepwise manner from second power consumption different from the first power consumption in the case where the load unit operates in the second operation mode after the first output voltage of the power supply apparatus is detected.

10. The method according to claim 7, wherein the load unit increases power consumption of the load unit in a stepwise manner from first power consumption in a case where the load unit operates in the first operation mode, and
- wherein the load unit increases the power consumption of the load unit in a stepwise manner from second power consumption different from the first power consumption in the case where the load unit operates in the second operation mode after the first output voltage of the power supply apparatus is detected.

11. The method according to claim 7, further comprising: displaying information for notifying a user of a type or an output capacity of the power supply apparatus on a display unit.

12. The method according to claim 7, wherein the load unit stops operating in the first operation mode or the second operation mode, in a case where a type or an output capacity of the power supply apparatus is not determined based on the detected first output voltage and the detected second output voltage.

13. A non-transitory storage medium that stores a program causing a computer to execute a method of controlling a device including a connection unit that is connected to a power supply apparatus and a load unit that operates as a constant power load, the method comprising:
- detecting a first output voltage of the power supply apparatus in a case where the load unit operates in a first operation mode;
- detecting a second output voltage of the power supply apparatus in a case where the load unit operates in a second operation mode after the first output voltage of the power supply apparatus is detected;
- determining a type or an output capacity of the power supply apparatus, based on the detected first output voltage; and
- determining a type or an output capacity of the power supply apparatus, based on the detected second output voltage, in a case where a type or an output capacity of the power supply apparatus is not determined based on the detected first output voltage.

14. The non-transitory storage medium according to claim 13, wherein the method further comprising:
- detecting a first output current of the power supply apparatus in a case where the load unit operates in the first operation mode; and
- detecting a second output current of the power supply apparatus in a case where the load unit operates in the second operation mode after the first output current of the power supply apparatus is detected,
- wherein a type or an output capacity of the power supply apparatus is determined based on the detected first output voltage and the detected first output current, and
- wherein a type or an output capacity of the power supply apparatus is determined based on the detected second output voltage and the detected second output current, in a case where a type or an output capacity of the power supply apparatus is not determined based on the detected first output voltage and the detected first output current.

15. The non-transitory storage medium according to claim 13, wherein the load unit changes power consumption of the load unit in a stepwise manner from first power consumption in a case where the load unit operates in the first operation mode, and
- wherein the load unit changes the power consumption of the load unit in a stepwise manner from second power consumption different from the first power consumption in the case where the load unit operates in the second operation mode after the first output voltage of the power supply apparatus is detected.

16. The non-transitory storage medium according to claim 13, wherein the load unit increases power consumption of the load unit in a stepwise manner from first power consumption in a case where the load unit operates in the first operation mode, and
- wherein the load unit increases the power consumption of the load unit in a stepwise manner from second power consumption different from the first power consumption in the case where the load unit operates in the second operation mode after the first output voltage of the power supply apparatus is detected.

17. The non-transitory storage medium according to claim 13, wherein the method further comprising:
- displaying information for notifying a user of a type or an output capacity of the power supply apparatus on a display unit.

18. The non-transitory storage medium according to claim 13, wherein the load unit stops operating in the first operation mode or the second operation mode, in a case where a type or an output capacity of the power supply apparatus is not determined based on the detected first output voltage and the detected second output voltage.

* * * * *